US010602638B2

(12) United States Patent
North et al.

(10) Patent No.: US 10,602,638 B2
(45) Date of Patent: Mar. 24, 2020

(54) SYSTEM AND METHOD OF TRANSFERRING ENERGY

(71) Applicant: Dell Products L.P., Round Rock, TX (US)

(72) Inventors: Travis Christian North, Cedar Park, TX (US); Qinghong He, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 15/909,014

(22) Filed: Mar. 1, 2018

(65) Prior Publication Data

US 2019/0274230 A1   Sep. 5, 2019

(51) Int. Cl.
*H05K 7/20* (2006.01)
(52) U.S. Cl.
CPC ..... *H05K 7/20154* (2013.01); *H05K 7/20309* (2013.01); *H05K 7/20318* (2013.01); *H05K 7/20327* (2013.01)

(58) Field of Classification Search
None
See application file for complete search history.

(56) References Cited

U.S. PATENT DOCUMENTS

| 1,329,559 | A | | 3/1920 | Tesla | |
|---|---|---|---|---|---|
| 5,587,880 | A | * | 12/1996 | Phillips | F28D 15/0266 165/104.29 |
| 5,816,313 | A | * | 10/1998 | Baker | F16K 15/048 165/41 |
| 7,713,421 | B2 | * | 5/2010 | Galbraith | B01J 20/3441 210/663 |
| 8,650,877 | B1 | | 2/2014 | Gustafson | |
| 2003/0124006 | A1 | * | 7/2003 | Dooley | F04B 43/09 417/412 |
| 2009/0260361 | A1 | * | 10/2009 | Prueitt | F01K 27/00 60/670 |
| 2011/0120451 | A1 | * | 5/2011 | Miles | F24S 70/10 126/635 |

(Continued)

OTHER PUBLICATIONS

S.F. de Vries et al., "Design and operation of a Tesla-type valve for pulsating heat pipes" International Journal of Heat and Mass Transfer 105 (2017) pp. 1-11.

*Primary Examiner* — Courtney L Smith
(74) *Attorney, Agent, or Firm* — Baker Botts L.L.P.

(57) ABSTRACT

In one or more embodiments, energy transfer device may include: a sealed housing having an evaporating region and a condensing region; a fluid; a Tesla valve enclosed in the housing, between the evaporating region and the condensing region and configured to transfer the fluid in a gaseous state from the evaporating region to the condensing region; and a first liquid fluid transfer structure enclosed in the housing, between the first condensing region and the first evaporating region and configured to transfer the fluid in a liquid state from the first condensing region to the first evaporating region. In one example, the liquid fluid transfer structure may include the Tesla valve. In another example, the liquid fluid transfer structure may include metal sintered particles. In one or more embodiments, the fluid may include one or more of acetone, ammonia, water, and a chlorofluorocarbon, among others.

12 Claims, 11 Drawing Sheets

(56) References Cited

U.S. PATENT DOCUMENTS

| | | | |
|---|---|---|---|
| 2013/0223010 A1* | 8/2013 | Shioga | H01L 23/13 |
| | | | 361/700 |
| 2014/0007569 A1* | 1/2014 | Gayton | F02G 1/055 |
| | | | 60/508 |
| 2014/0166134 A1* | 6/2014 | Satitpunwaycha | F04B 1/00 |
| | | | 137/565.13 |
| 2017/0229375 A1* | 8/2017 | Haj-Hariri | H01L 23/427 |
| 2017/0299239 A1* | 10/2017 | Steven | F25B 39/00 |

* cited by examiner

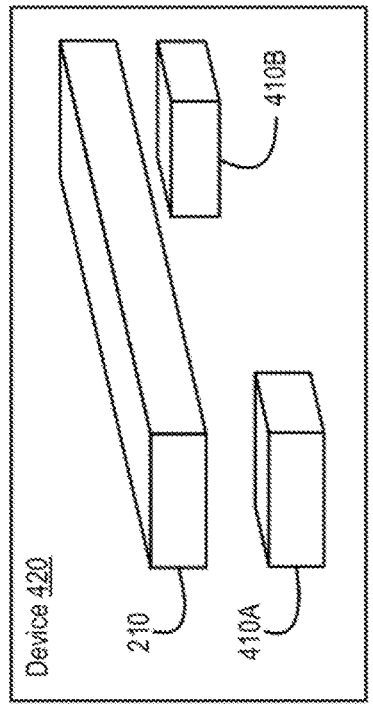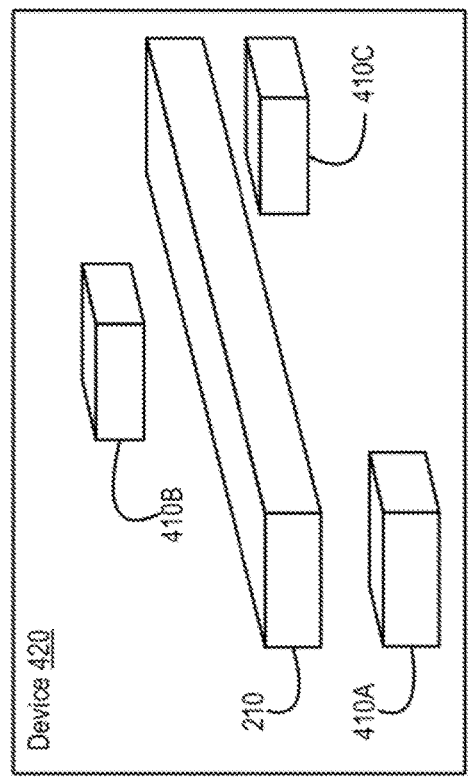
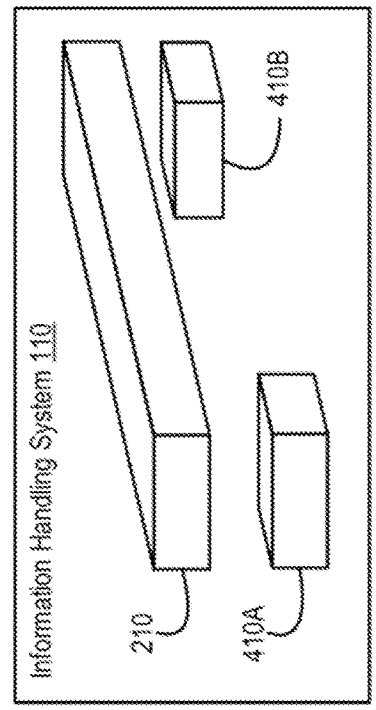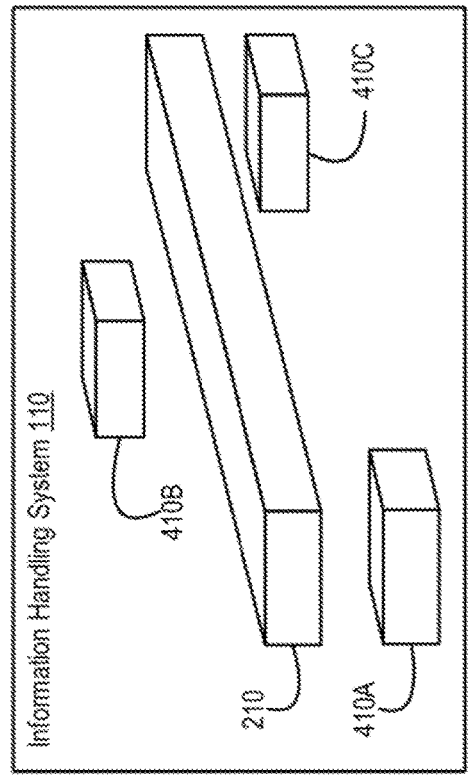
FIG. 4E
FIG. 4F

SYSTEM AND METHOD OF TRANSFERRING ENERGY

BACKGROUND

Field of the Disclosure

This disclosure relates generally to information handling systems and more particularly to transferring energy.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems. Moreover, components of information handling systems generate heat, which may need to be transferred from some of the components.

SUMMARY

In one or more embodiments, energy may be transferred from a hardware component of an information handling system or a device. For example, energy in a form of heat may be transferred from a hardware component of an information handling system or a device. In one or more embodiments, an energy transfer device may be utilized in transferring heat from a hardware component of an information handling system or a device without the heat being returned to the hardware component by the energy transfer device. For example, the energy transfer device may transfer heat in a single direction. For instance, the energy transfer device may abate or mitigate an inverse energy flow.

In one or more embodiments, an energy transfer device may include a housing. For example, the housing may be a sealed housing. In one or more embodiments, the energy transfer device may include a first evaporating region and a first condensing region. For example, the first evaporating region may be thermally coupled to a hardware component of an information handling system or a device. For instance, the energy transfer device may transfer heat from the hardware component without the heat being returned to the hardware component by the energy transfer device. In one or more embodiments, the energy transfer device may include a fluid. For example, the fluid may be sealed in the housing of the energy transfer device. In one instance, at least a portion of the fluid may exist in a gaseous state. In another instance, at least a portion of the fluid may exist in a liquid state. In one or more embodiments, the first fluid may include one or more of acetone, ammonia, water, and a chlorofluorocarbon, among others. In one or more embodiments, the energy transfer device may include a first Tesla valve. In one example, the first Tesla valve may be enclosed in the housing of the energy transfer device. In another example, the first Tesla valve may be between the first evaporating region and the first condensing region. For instance, the first Tesla valve may be configured to transfer the fluid in the gaseous state from the first evaporating region to the first condensing region.

In one or more embodiments, the energy transfer device may include a first liquid fluid transfer structure. In one example, the first liquid fluid transfer structure may be enclosed in the housing of the energy transfer device. In a second example, the first liquid fluid transfer structure may include the first Tesla valve. In one instance, the first Tesla valve may be molded into the first liquid fluid transfer structure. In another instance, the first Tesla valve may be cut into the first liquid fluid transfer structure. In another example, the first liquid fluid transfer structure may be between the first condensing region and the first evaporating region. For instance, the first liquid fluid transfer structure may be configured to transfer the fluid in the liquid state from the first condensing region to the first evaporating region. In one or more embodiments, the first liquid fluid transfer structure may wick the fluid in the liquid state from the first condensing region to the first evaporating region. For example, the first liquid fluid transfer structure may include metal sintered particles. For instance, the metal sintered particles may include one or more of copper sintered particles, titanium sintered particles, and aluminum sintered particles, among others.

In one or more embodiments, the energy transfer device may include multiple Tesla valves, multiple evaporating regions, multiple condensing regions, and/or multiple liquid fluid transfer structures. For example, the energy transfer device may include a second Tesla valve enclosed in the housing of the energy transfer device, a second liquid fluid transfer structure enclosed in the housing of the energy transfer device, a second condensing region, and a second evaporating region, among others. In one or more embodiments, the first Tesla valve may interpose the first evaporating region and the first evaporating region. In one or more embodiments, the second Tesla valve may interpose the second evaporating region and the second condensing region. For example, the second Tesla valve may be configured to transfer the fluid in the gaseous state from the second evaporating region to the second condensing region.

BRIEF DESCRIPTION OF THE DRAWINGS

For a more complete understanding of the present disclosure and its features/advantages, reference is now made to the following description, taken in conjunction with the accompanying drawings, which are not drawn to scale, and in which:

FIGS. 4E and 4F illustrate examples of an information handling system and a device, according to one or more embodiments.

DETAILED DESCRIPTION

Figure 1:
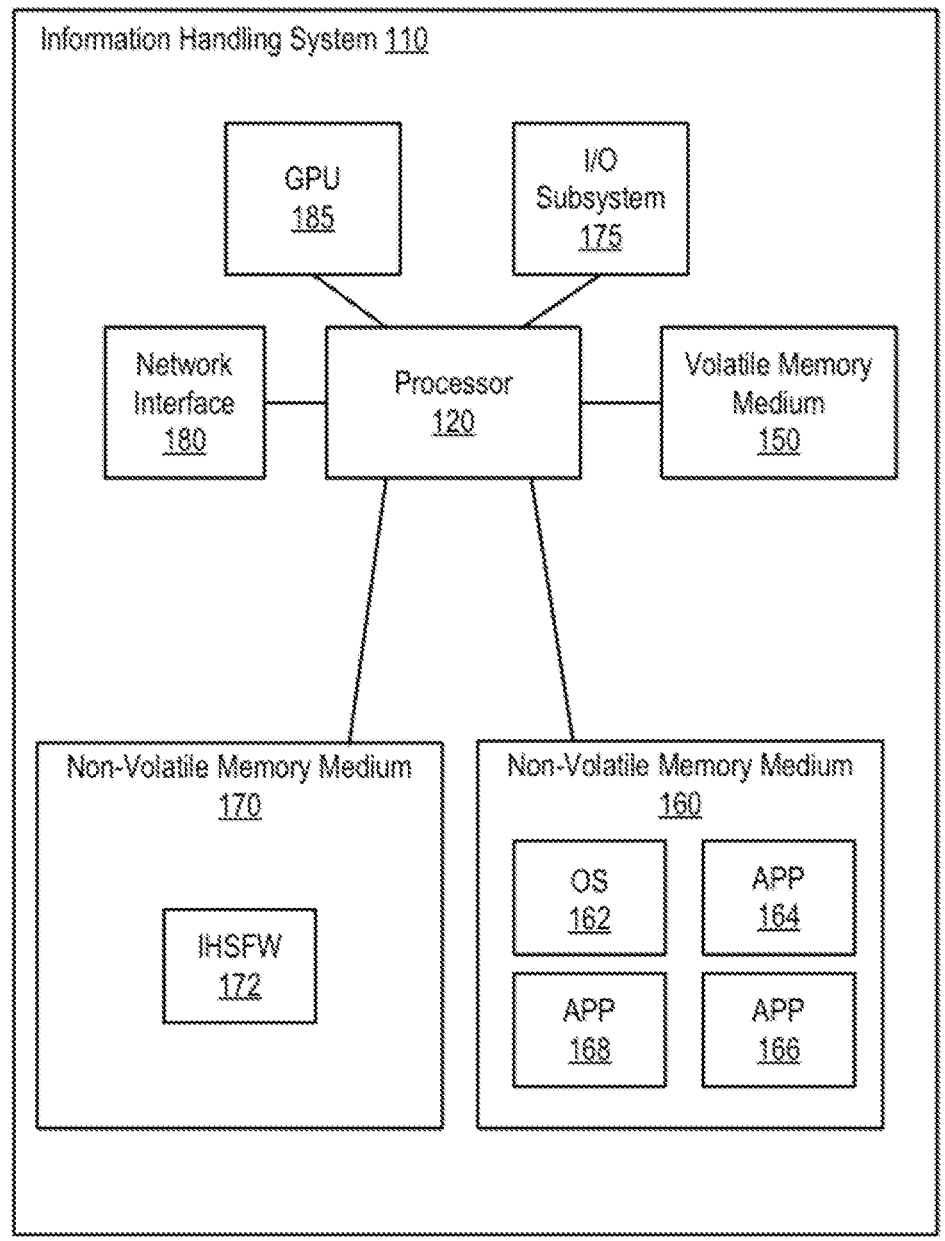
FIG. 1 illustrates an example of an information handling system, according to one or more embodiments.

In the following description, details are set forth by way of example to facilitate discussion of the disclosed subject matter. It should be apparent to a person of ordinary skill in the field, however, that the disclosed embodiments are exemplary and not exhaustive of all possible embodiments.

As used herein, a reference numeral refers to a class or type of entity, and any letter following such reference numeral refers to a specific instance of a particular entity of that class or type. Thus, for example, a hypothetical entity referenced by '12A' may refer to a particular instance of a particular class/type, and the reference '12' may refer to a collection of instances belonging to that particular class/type or any one instance of that class/type in general.

In one or more embodiments, energy may be transferred from a hardware component of an information handling system. For example, energy in a form of heat may be transferred from a hardware component of an information handling system. In one or more embodiments, an energy transfer device may be utilized in transferring heat from a hardware component of an information handling system without the heat being returned to the hardware component by the energy transfer device. For example, the energy transfer device may transfer heat in a single direction. For instance, the energy transfer device may abate or mitigate an inverse energy flow.

In one or more embodiments, the energy transfer device may include a wicking structure that may directionally control a vapor operating pressure. For example, a Tesla valve may be constructed in the wicking structure. For instance, the wicking structure may include sintered particles, which may transfer a fluid in its liquid form in a first direction, and the Tesla valve may transfer the fluid in its vapor form in a second direction, opposite the first direction.

In one or more embodiments, the energy transfer device may include an evaporator portion and a condenser portion. For example, the energy transfer device may transfer heat, from a hardware component of an information handling system proximate to the evaporator portion, to the condenser portion. For instance, the heat may be transferred from the condenser portion. In one or more embodiments, utilizing a Tesla valve may allow and/or permit an operational pressure of the energy transfer device to be tuned for directional dependency. For example, utilizing a Tesla valve may allow and/or permit a saturation pressure to increase by a factor of three and a half times for a condition of when the condenser is reversed and higher temperature than the original evaporator. For instance, the operational pressure may reduce a maximum power transport capability of the energy transfer device by ninety percent (90%), which may reduce an amount of energy that may be transferred in a reversed direction before dry out. This may allow and/or permit for dry out to break a thermal circuit, in effect allowing and/or permitting for one directional energy flow, according to one or more embodiments.

In one or more embodiments, the energy transfer device may transfer heat from a first hardware component of the information handling system to a second hardware component of the information handling system. In one example, the energy transfer device may transfer heat from a processor (e.g., a central processing unit) of the information handling system to a graphics processing unit of the information handling system. In a second example, the energy transfer device may transfer heat from the processor of the information handling system to a fan of the information handling system. In another example, the energy transfer device may transfer heat from the processor of the information handling system to a chassis of the information handling system.

Turning now to FIG. 1, an exemplary information handling system is illustrated, according to one or more embodiments. An information handling system (IHS) 110 may include a hardware resource or an aggregate of hardware resources operable to compute, classify, process, transmit, receive, retrieve, originate, switch, store, display, manifest, detect, record, reproduce, handle, and/or utilize various forms of information, intelligence, or data for business, scientific, control, entertainment, or other purposes, according to one or more embodiments. For example, IHS 110 may be a personal computer, a desktop computer system, a laptop computer system, a server computer system, a mobile device, a tablet computing device, a personal digital assistant (PDA), a consumer electronic device, an electronic music player, an electronic camera, an electronic video player, a wireless access point, a network storage device, or another suitable device and may vary in size, shape, performance, functionality, and price. In one or more embodiments, a portable IHS 110 may include or have a form factor of that of or similar to one or more of a laptop, a notebook, a telephone, a tablet, and a PDA, among others. For example, a portable IHS 110 may be readily carried and/or transported by a user (e.g., a person). In one or more embodiments, components of IHS 110 may include one or more storage devices, one or more communications ports for communicating with external devices as well as various input and output (I/O) devices, such as a keyboard, a mouse, and a video display, among others. In one or more embodiments, IHS 110 may include one or more buses operable to transmit communication between or among two or more hardware components. In one example, a bus of IHS 110 may include one or more of a memory bus, a peripheral bus, and a local bus, among others. In another example, a bus of IHS 110 may include one or more of a Micro Channel Architecture (MCA) bus, an Industry Standard Architecture (ISA) bus, an Enhanced ISA (EISA) bus, a Peripheral Component Interconnect (PCI) bus, HyperTransport (HT) bus, an inter-integrated circuit ($I^2C$) bus, a serial peripheral interface (SPI) bus, a low pin count (LPC) bus, an enhanced serial peripheral interface (eSPI) bus, a universal serial bus (USB), a system management bus (SMBus), and a Video Electronics Standards Association (VESA) local bus, among others.

In one or more embodiments, IHS 110 may include firmware that controls and/or communicates with one or more hard drives, network circuitry, one or more memory devices, one or more I/O devices, and/or one or more other peripheral devices. For example, firmware may include software embedded in an IHS component utilized to perform tasks. In one or more embodiments, firmware may be stored in non-volatile memory, such as storage that does not lose stored data upon loss of power. In one example, firmware associated with an IHS component may be stored in non-volatile memory that is accessible to one or more IHS components. In another example, firmware associated with an IHS component may be stored in non-volatile memory that may be dedicated to and includes part of that component. For instance, an embedded controller may include firmware that may be stored via non-volatile memory that may be dedicated to and includes part of the embedded controller.

As shown, IHS 110 may include a processor 120, a volatile memory medium 150, non-volatile memory media 160 and 170, an I/O subsystem 175, a network interface 180, and a graphics processing unit (GPU) 185. As illustrated, volatile memory medium 150, non-volatile memory media 160 and 170, I/O subsystem 175, network interface 180, and GPU 185 may be communicatively coupled to processor 120.

In one or more embodiments, one or more of volatile memory medium 150, non-volatile memory media 160 and 170, I/O subsystem 175, network interface 180, and GPU 185 may be communicatively coupled to processor 120 via one or more buses, one or more switches, and/or one or more root complexes, among others. In one example, one or more of volatile memory medium 150, non-volatile memory media 160 and 170, I/O subsystem 175, network interface 180, and GPU 185 may be communicatively coupled to processor 120 via one or more PCI-Express (PCIe) root complexes. In another example, one or more of an I/O subsystem 175 and a network interface 180 may be communicatively coupled to processor 120 via one or more PCIe switches.

In one or more embodiments, the term "memory medium" may mean a "storage device", a "memory", a "memory device", a "tangible computer readable storage medium", and/or a "computer-readable medium". For example, computer-readable media may include, without limitation, storage media such as a direct access storage device (e.g., a hard disk drive, a floppy disk, etc.), a sequential access storage device (e.g., a tape disk drive), a compact disk (CD), a CD-ROM, a digital versatile disc (DVD), a random access memory (RAM), a read-only memory (ROM), a one-time programmable (OTP) memory, an electrically erasable programmable read-only memory (EEPROM), and/or a flash memory, a solid state drive (SSD), or any combination of the foregoing, among others.

In one or more embodiments, one or more protocols may be utilized in transferring data to and/or from a memory medium. For example, the one or more protocols may include one or more of small computer system interface (SCSI), Serial Attached SCSI (SAS) or another transport that operates with the SCSI protocol, advanced technology attachment (ATA), serial ATA (SATA), a USB interface, an Institute of Electrical and Electronics Engineers (IEEE) 1394 interface, a Thunderbolt interface, an advanced technology attachment packet interface (ATAPI), serial storage architecture (SSA), integrated drive electronics (IDE), or any combination thereof, among others.

Volatile memory medium 150 may include volatile storage such as, for example, RAM, DRAM (dynamic RAM), EDO RAM (extended data out RAM), SRAM (static RAM), etc. One or more of non-volatile memory media 160 and 170 may include nonvolatile storage such as, for example, a read only memory (ROM), a programmable ROM (PROM), an erasable PROM (EPROM), an electrically erasable PROM, NVRAM (non-volatile RAM), ferroelectric RAM (FRAM), a magnetic medium (e.g., a hard drive, a floppy disk, a magnetic tape, etc.), optical storage (e.g., a CD, a DVD, a BLU-RAY disc, etc.), flash memory, a SSD, etc. In one or more embodiments, a memory medium can include one or more volatile storages and/or one or more nonvolatile storages.

In one or more embodiments, network interface 180 may be utilized in communicating with one or more networks and/or one or more other information handling systems. In one example, network interface 180 may enable IHS 110 to communicate via a network utilizing a suitable transmission protocol and/or standard. In a second example, network interface 180 may be coupled to a wired network. In a third example, network interface 180 may be coupled to an optical network. In another example, network interface 180 may be coupled to a wireless network.

In one or more embodiments, network interface 180 may be communicatively coupled via a network to a network storage resource. For example, the network may be implemented as, or may be a part of, a storage area network (SAN), personal area network (PAN), local area network (LAN), a metropolitan area network (MAN), a wide area network (WAN), a wireless local area network (WLAN), a virtual private network (VPN), an intranet, an Internet or another appropriate architecture or system that facilitates the communication of signals, data and/or messages (generally referred to as data). For instance, the network may transmit data utilizing a desired storage and/or communication protocol, including one or more of Fibre Channel, Frame Relay, Asynchronous Transfer Mode (ATM), Internet protocol (IP), other packet-based protocol, Internet SCSI (iSCSI), or any combination thereof, among others.

In one or more embodiments, processor 120 may execute processor instructions in implementing one or more systems, flowcharts, methods, and/or processes described herein. In one example, processor 120 may execute processor instructions from one or more of memory media 150-170 in implementing one or more systems, flowcharts, methods, and/or processes described herein. In another example, processor 120 may execute processor instructions via network interface 180 in implementing one or more systems, flowcharts, methods, and/or processes described herein.

In one or more embodiments, processor 120 may include one or more of a system, a device, and an apparatus operable to interpret and/or execute program instructions and/or process data, among others, and may include one or more of a microprocessor, a microcontroller, a digital signal processor (DSP), an application specific integrated circuit (ASIC), and another digital or analog circuitry configured to interpret and/or execute program instructions and/or process data, among others. In one example, processor 120 may interpret and/or execute program instructions and/or process data stored locally (e.g., via memory media 150-170 and/or another component of IHS 110). In another example, processor 120 may interpret and/or execute program instructions and/or process data stored remotely (e.g., via a network storage resource).

In one or more embodiments, I/O subsystem 175 may represent a variety of communication interfaces, graphics interfaces, video interfaces, user input interfaces, and/or peripheral interfaces, among others. For example, I/O subsystem 175 may include one or more of a touch panel and a display adapter, among others. For instance, a touch panel may include circuitry that enables touch functionality in conjunction with a display that is driven by a display adapter.

As shown, non-volatile memory medium 160 may include an operating system (OS) 162, and applications (APPs) 164-168. In one or more embodiments, one or more of OS 162 and APPs 164-168 may include processor instructions executable by processor 120. In one example, processor 120 may execute processor instructions of one or more of OS 162 and APPs 164-168 via non-volatile memory medium 160. In a second example, one or more portions of the processor instructions of the one or more of OS 162 and APPs 164-168 may be transferred to volatile memory medium 150, and processor 120 may execute the one or more portions of the processor instructions of the one or more of OS 162 and APPs 164-168 via volatile memory medium 150. In another example, processor 120 may execute processor instructions of one or more of OS 162 and APPs 164-168 to handle information. For example, handling information may include processing information. For instance, processing information may include processing data.

As illustrated, non-volatile memory medium 170 may include information handling system firmware (IHSFW) 172. In one or more embodiments, IHSFW 172 may include processor instructions executable by processor 120. For example, IHSFW 172 may include one or more structures and/or functionalities of one or more of a basic input/output system (BIOS), an Extensible Firmware Interface (EFI), a Unified Extensible Firmware Interface (UEFI), and an Advanced Configuration and Power Interface (ACPI), among others. In one instance, processor 120 may execute processor instructions of IHSFW 172 via non-volatile memory medium 170. In another instance, one or more portions of the processor instructions of IHSFW 172 may be transferred to volatile memory medium 150, and processor 120 may execute the one or more portions of the processor instructions of IHSFW 172 via volatile memory medium 150.

In one or more embodiments, processor 120 and one or more components of IHS 110 may be included in a system-on-chip (SoC). For example, the SoC may include processor 120 and a platform controller hub (not specifically illustrated).

Figure 2A:
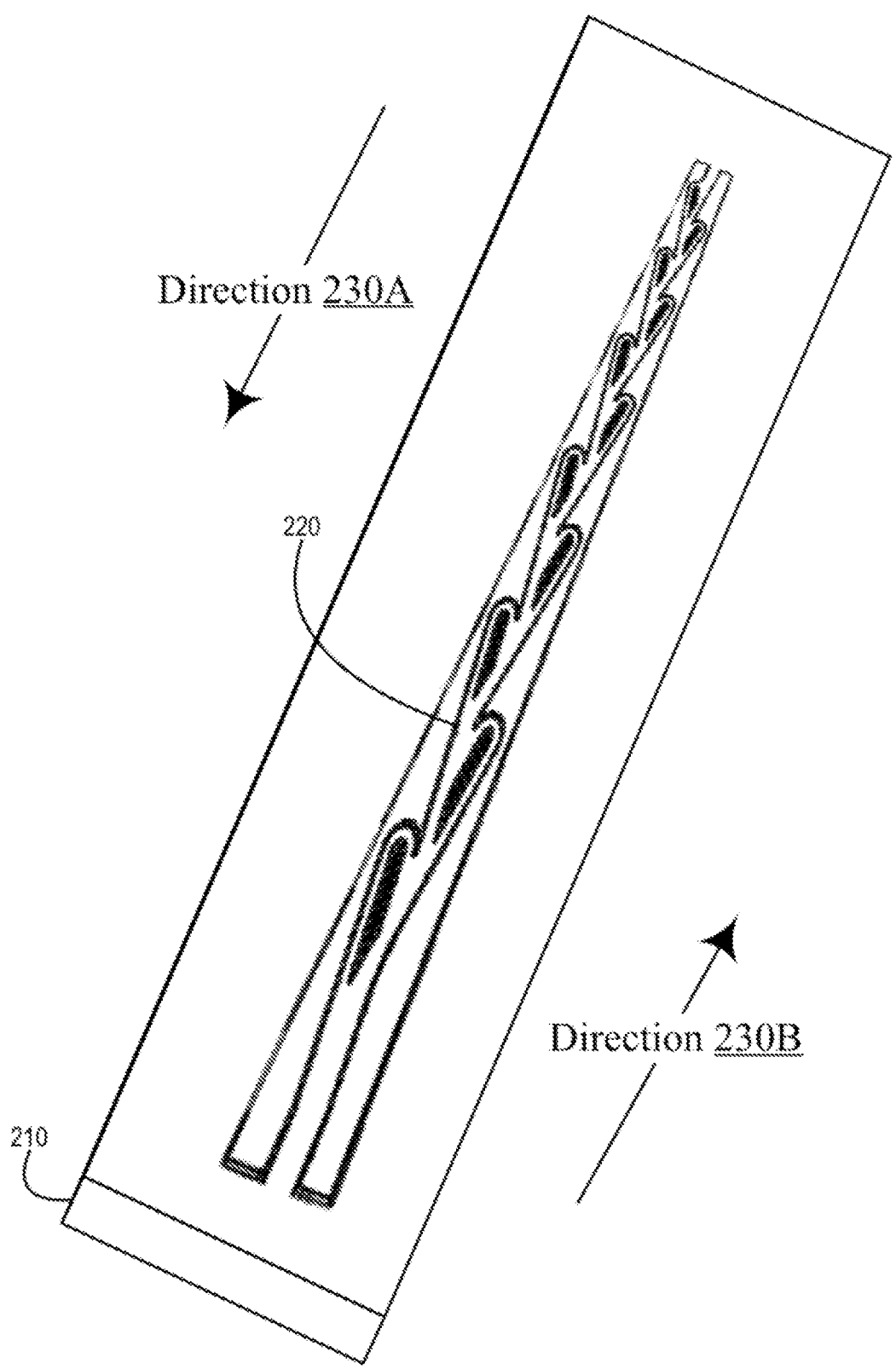
FIG. 2A illustrates an example heat transfer device, according to one or more embodiments.

Turning now to FIG. 2A, an example energy transfer device is illustrated, according to one or more embodiments. As shown, an example energy transfer device 210 may include a Tesla valve 220. In one or more embodiments, a fluid in its vapor form or state may move in a direction 230A. For example, the fluid in its vapor or state form may move in direction 230A with less resistance than moving in a direction 230B. In one or more embodiments, a fluid in its vapor form or state may include the fluid in its gaseous form or state. In one or more embodiments, the fluid in its liquid form may move in direction 230B. For example, energy transfer device 210 may include a wicking structure that transfers the fluid in its liquid form or state via direction 230B. For instance, the wicking structure may include copper sintered particles.

In one or more embodiments, the fluid may be or include acetone, ammonia, or water, among others. Some example properties associated with some fluids are available in Table 1.

TABLE 1

| Fluid | Workable Temperature Range (° C.) | Internal Energy kJ/kg 180 C. | Density kg/m$^3$ 180 C. |
|---|---|---|---|
| Acetone | 0 to 120 | 495 | 4.05 |
| Ammonia | −60 to 100 | 891 | 34 |
| Water | 0 to 100 | 335 | 972 |

In one or more embodiments, another fluid may be utilized. For example, a chlorofluorocarbon (CFC) may be utilized as the fluid. For instance, a CFC may be utilized in a space-based application. In one or more embodiments, energy transfer device 210 may include a base. For example, the base may be or include a grooved pipe or a straight pipe, among others. In one or more embodiments, energy transfer device 210 may include a housing. In one example, a housing of energy transfer device 210 may be or include a metal. In one instance, the metal may be or include copper. In a second instance, the metal may be or include titanium. In another instance, the metal may be or include aluminum. In another example, a housing of energy transfer device 210 may be a sealed housing.

Figure 2B:
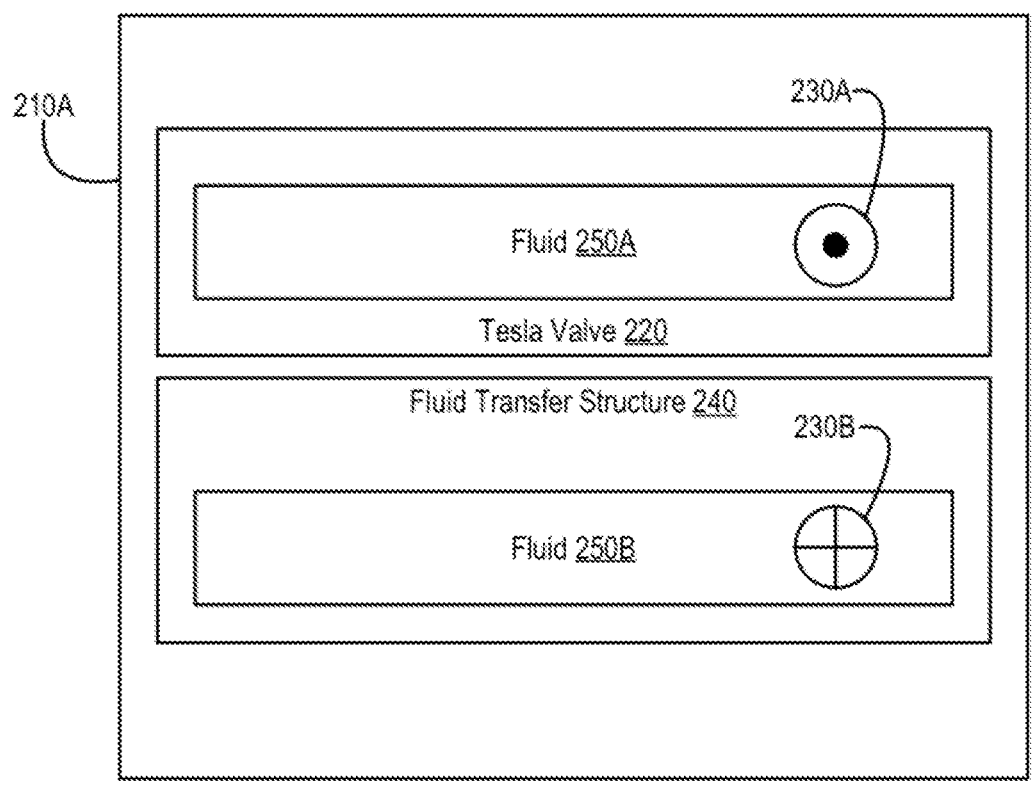
FIG. 2B illustrates an example cross section of an example energy transfer device, according to one or more embodiments.

Turning now to FIG. 2B, an example cross section of an example energy transfer device is illustrated, according to one or more embodiments. As shown, an energy transfer device 210A may include Tesla valve 220 and a fluid transfer structure 240. In one or more embodiments, fluid transfer structure 240 may be or include a wicking structure. For example, fluid transfer structure 240 may include sintered particles. For instance, the sintered particles may be or include copper sintered particles. In one or more embodiments, fluid transfer structure 240 may be or include a liquid transfer structure. For example, fluid transfer structure 240 may transfer fluid 250 in its liquid state. For instance, fluid transfer structure 240 may be configured to transfer fluid 250 in its liquid state. In one or more embodiments, configuring fluid transfer structure 240 to transfer fluid 250 in its liquid state may include configuring fluid transfer structure 240 with metal sintered particles. For example, the metal sintered particles may include one or more of copper sintered particles, titanium sintered particles, and aluminum sintered particles, among others. In one or more embodiments, the metal sintered particles of fluid transfer structure 240 may permit, allow, and/or enable fluid transfer structure 240 to transfer fluid 250 in its liquid state via wicking fluid 250 in its liquid state. As illustrated, Tesla valve 220 and fluid transfer structure 240 may transport and/or transfer a fluid 250. In one example, fluid 250A may be fluid 250 in a vaporized and/or gaseous state. In another example, fluid 250B may be fluid 250 in a liquid state.

Figure 2C:
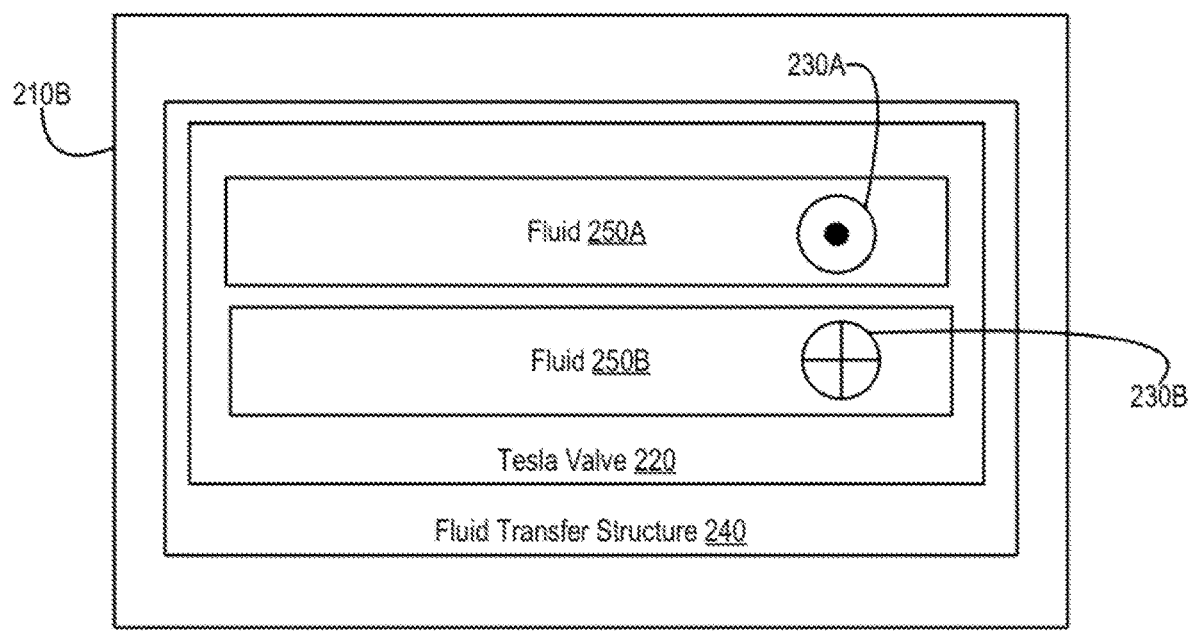
FIG. 2C illustrates another example cross section of an example energy transfer device, according to one or more embodiments.

Turning now to FIG. 2C, another example cross section of an example energy transfer device is illustrated, according to one or more embodiments. As shown, an energy transfer device 210B may include Tesla valve 220. In one or more embodiments, Tesla valve 220 may be constructed in a wicking structure. For example, fluid transfer structure 240 may include the wicking structure. In one or more embodiments, Tesla valve 220 may be constructed in fluid transfer structure 240. For example, fluid transfer structure 240 may include sintered particles. For instance, the sintered particles may be or include copper sintered particles. In one or more embodiments, fluid transfer structure 240 may be or include a liquid transfer structure. For example, fluid transfer structure 240 may transfer fluid 250 in its liquid state. For instance, fluid transfer structure 240 may be configured to transfer fluid 250 in its liquid state. In one or more embodiments, configuring fluid transfer structure 240 to transfer fluid 250 in its liquid state may include configuring fluid transfer structure 240 with metal sintered particles. For example, the metal sintered particles may include one or more of copper sintered particles, titanium sintered particles, and aluminum sintered particles, among others. In one or more embodiments, the metal sintered particles of fluid transfer structure 240 may permit, allow, and/or enable fluid transfer structure 240 to transfer fluid 250 in its liquid state via wicking fluid 250 in its liquid state.

In one or more embodiments, Tesla valve 220 may be molded in fluid transfer structure 240. In one or more embodiments, Tesla valve 220 may include sintered particles. In one example, Tesla valve 220 may be constructed with sintered particles. For instance, the sintered particles may be or include copper sintered particles. In another example, the sintered particles may be formed into a Tesla valve shape, which may allow for a dual purpose sintered particle wicking structure and pressure regulation. In one or more embodiments, Tesla valve 220 may be molded in a wicking structure.

In one or more embodiments, energy transfer device 210 may include an integration of the Tesla valve/pressure regulator into the sintered particle structure. For example, a vapor chamber approach may be utilized, where a top cap may be brazed to a base of energy transfer device 210. In one or more embodiments, a traditional mandrel (round pipe structure) used for sintered particle distribution may be replaced with a form that allows for the wicking structure to take a shape of a Tesla valve structure. For example, the sintered structure may be baked into a pipe structure. For instance, the sintered structure may be inserted into the pipe structure.

In one or more embodiments, the sintered particles may be or include copper sintered particles. For example, the sintered particles may be or include copper powder ranging from 45 μm to 56 μm with a porosity close to 28.7% up to 200 μm with a porosity around 35%. In one or more embodiments, water or acetone may be used with copper. In one or more embodiments, ammonia may be utilized with aluminum or titanium.

Figure 3A:
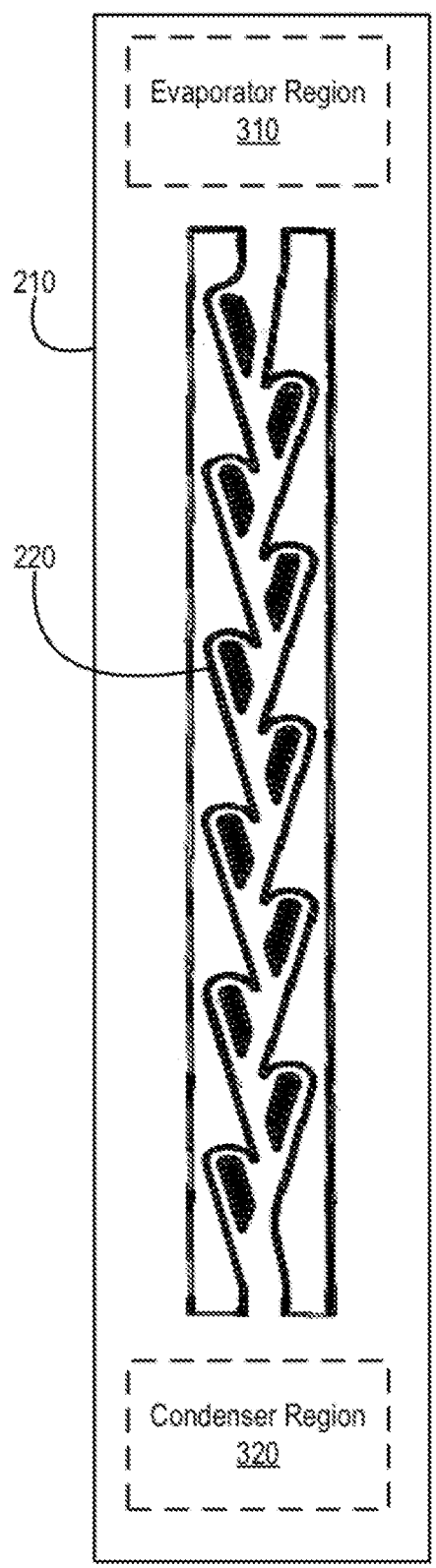
FIG. 3A illustrates another example of an energy transfer device, according to one or more embodiments.

Turning now to FIG. 3A, another example of an energy transfer device is illustrated, according to one or more embodiments. As shown, energy transfer device 210 may include an evaporator region 310. For example, evaporator region 310 may be located at a first end of energy transfer device 210. In one or more embodiments, fluid 250B may transform into fluid 250A in evaporator region 310. As illustrated, energy transfer device 210 may include a condenser region 320. For example, condenser region 320 may be located at a second end of energy transfer device 210. In one or more embodiments, fluid 250A may transform into fluid 250B in condenser region 320.

Figure 3B:
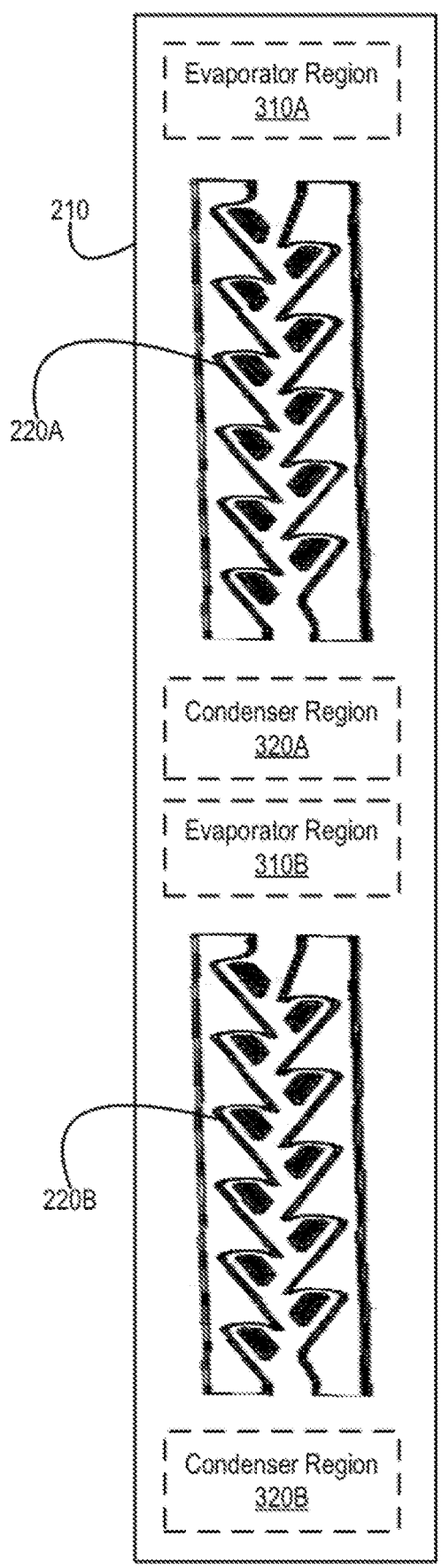
FIG. 3B illustrates an example of an energy transfer device with multiple Tesla valves, according to one or more embodiments.

Turning now to FIG. 3B, an example of an energy transfer device with multiple Tesla valves is illustrated, according to one or more embodiments. As shown, energy transfer device 210 may include Tesla valves 220A and 220B. As illustrated, energy transfer device 210 may include evaporator regions 310A and 310B. As shown, energy transfer device 210 may include condenser regions 320A and 320B. In one or more embodiments, fluid 250B may transform into fluid 250A in evaporator region 310A. In one or more embodiments, fluid 250B may transform into fluid 250A in evaporator region 310B. In one or more embodiments, fluid 250A may transform into fluid 250B in condenser region 320A. In one or more embodiments, fluid 250A may transform into fluid 250B in condenser region 320B.

Figure 3C:
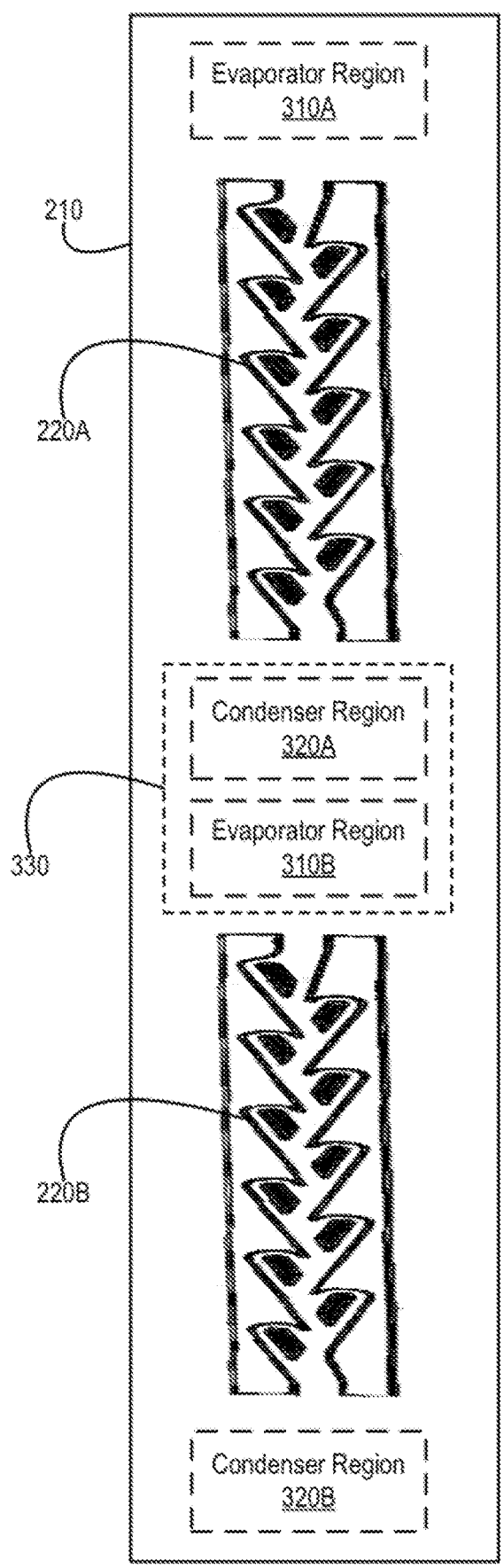
FIG. 3C illustrates another example of an energy transfer device with multiple Tesla valves, according to one or more embodiments.

Turning now to FIG. 3C, another example of an energy transfer device with multiple Tesla valves is illustrated, according to one or more embodiments. As shown, energy transfer device 210 may include Tesla valves 220A and 220B. As illustrated, energy transfer device 210 may include evaporator regions 310A and 310B. As shown, energy transfer device 210 may include condenser regions 320A and 320B. In one or more embodiments, fluid 250B may transform into fluid 250A in evaporator region 310A. In one or more embodiments, fluid 250B may transform into fluid 250A in evaporator region 310B. In one or more embodiments, fluid 250A may transform into fluid 250B in condenser region 320A. In one or more embodiments, fluid 250A may transform into fluid 250B in condenser region 320B. In one or more embodiments, a region 330 may be or include a multifunction region. In one or more embodiments, condenser region 320A and evaporator regions 310B may form multifunction region 330. In one example, region 330 may evaporate fluid 250B into fluid 250A. In another example, region 330 may condense fluid 250A into fluid 250B. In one or more embodiments, region 330 may evaporate or condense fluid 250 based on a temperature of region 330. In one or more embodiments, energy transfer device 210 may include any number of evaporating regions, and Tesla valves, condensing regions arranged in a series fashion, as described with reference to FIGS. 3B and 3C.

Figure 4A:
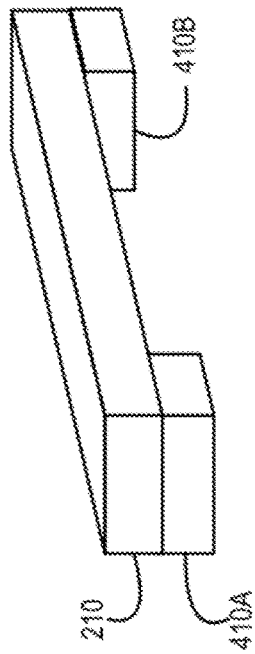
FIG. 4A illustrates an example of an energy transfer device and an example of multiple components, according to one or more embodiments.
Figure 4A:
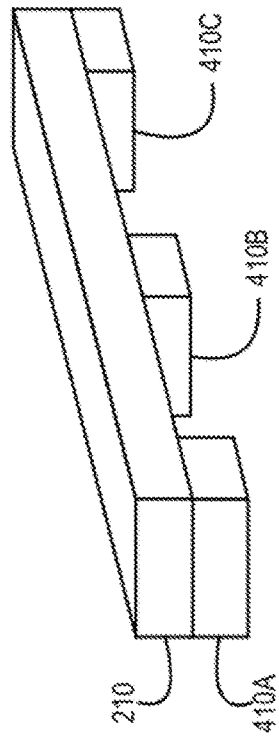

Turning now to FIG. 4A, an example of an energy transfer device and an example of multiple components are illustrated, according to one or more embodiments. As shown, components 410A and 410B may be placed on and/or positioned on energy transfer device 210. In one or more embodiments, components 410A and 410B may be thermally coupled to energy transfer device 210. In one or more embodiments, component 410 may be or include any component of IHS 110. In one example, component 410 may be or include any of components 120-185, among others. In another example, component 410 may be or include one or more of a fan, a heatsink, at least a portion of a chassis (e.g., a chassis of IHS 110, a chassis of a device 420, etc.), at least a portion of a housing (e.g., a housing of IHS 110, a housing of device 420, etc.), among others. In one or more embodiments, energy transfer device 210 may transfer energy from component 410A to component 410B. For example, energy transfer device 210 may transfer heat from component 410A to component 410B. In one instance, component 410A may produce heat. In another instance, component 410B may absorb heat and/or dissipate heat. In one or more embodiments, energy transfer device 210 may be placed on and/or positioned on components 410A and 410B such that evaporating region 310 is at, near, or proximate to component 410A and condensing region 320 is at or near component 410B.

Figure 4B:
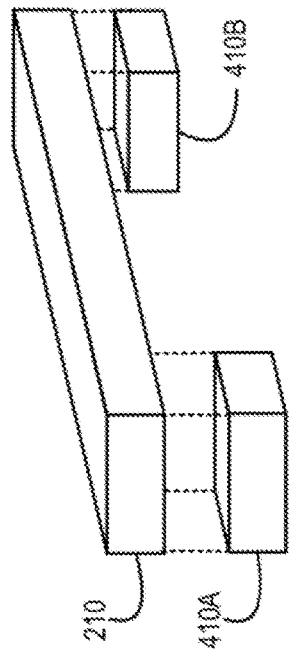
FIGS. 4B-4D illustrate other examples of an energy transfer device and other examples of multiple components, according to one or more embodiments.
Figure 4B:
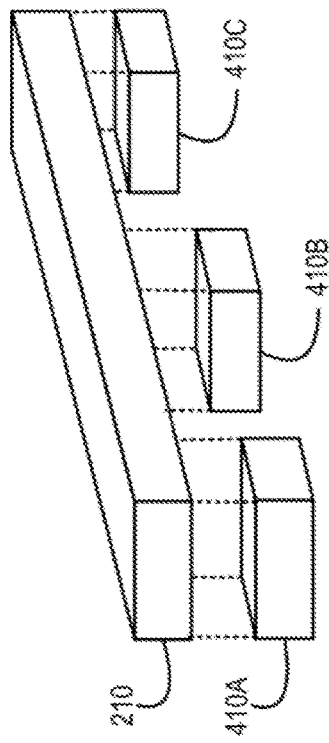
Figure 4C:
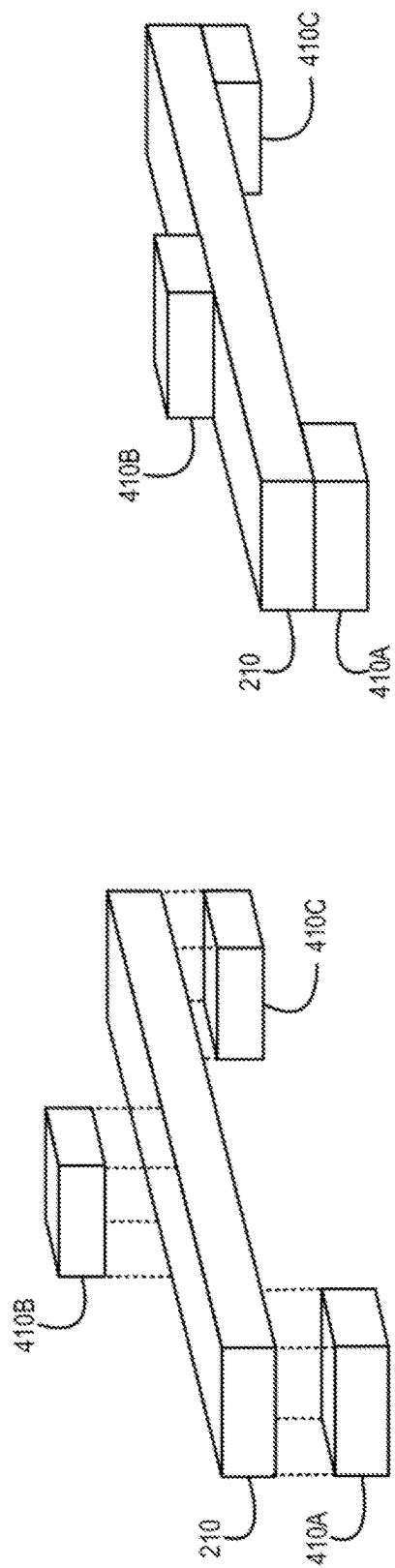
Figure 4D:
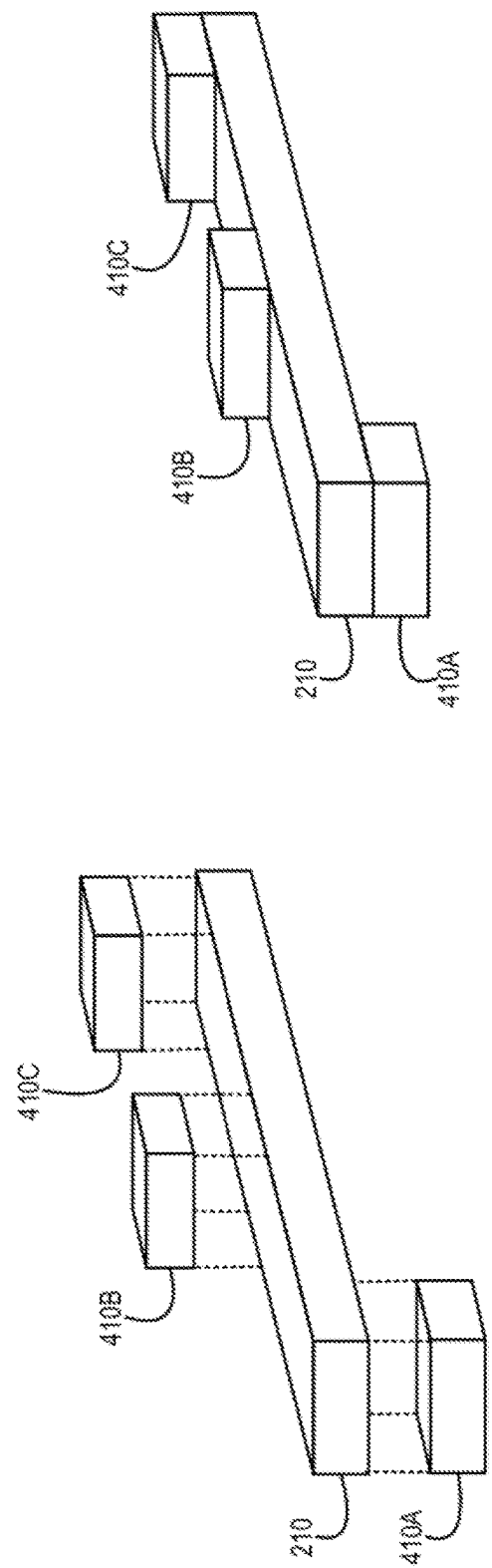

Turning now to FIGS. 4B-4D, other examples of an energy transfer device and other examples of multiple components are illustrated, according to one or more embodiments. As shown, components 410A-410C may be placed on and/or positioned on energy transfer device 210. In one or more embodiments, components 410A-410C may be thermally coupled to energy transfer device 210. In one or more embodiments, component 410 may be or include any component of IHS 110. In one example, component 410 may be or include any of components 120-185, among others. In another example, component 410 may be or include one or more of a fan, a heatsink, and at least a portion of a chassis, among others.

In one or more embodiments, energy transfer device 210 may transfer energy from component 410A to component 410B. In one example, energy transfer device 210 may transfer heat from component 410A to component 410B. In one instance, component 410A may produce heat. In another instance, component 410B may absorb heat and/or dissipate heat. In another example, energy transfer device 210 may transfer heat from component 410A to condenser region 320A and/or region 330.

In one or more embodiments, energy transfer device 210 may transfer energy from component 410B to component 410C. In one example, energy transfer device 210 may transfer heat from component 410B to component 410C. In one instance, component 410B may produce heat. In another instance, component 410C may absorb heat and/or dissipate heat. In a second example, energy transfer device 210 may transfer heat from component 410B to condenser region 320B. In another example, energy transfer device 210 may transfer heat from component evaporator region 310B and/or region 330 to condenser region 320B and/or component 410C.

In one or more embodiments, energy transfer device 210 may be placed on and/or positioned on components 410A-410C. In one example, energy transfer device 210 may be placed on and/or positioned on components 410A-410C such that evaporating region 310A is at, near, or proximate to component 410A. In a second example, energy transfer device 210 may be placed on and/or positioned on components 410A-410C such that evaporating region 310B and/or condensing region 320A is at, near, or proximate to component 410B. In a third example, energy transfer device 210 may be placed on and/or positioned on components 410A-410C such that region 330 is at, near, or proximate to components 410B. In another example, energy transfer device 210 may be placed on and/or positioned on components 410A-410C such that condensing region 320B is at, near, or proximate to component 410C.

In one or more embodiments, components 410 and energy transfer device 210 may be arranged in various ways. In one example, components 410A and 410C may be at or near a first side of energy transfer device 210, and component 410B may be at or near a second side of energy transfer device 210, as illustrated in FIG. 4C. In another example, component 410A may be at or near a first side of energy transfer device 210, and components 410B and 410C may be at or near a second side of energy transfer device 210, as illustrated in FIG. 4D. In one or more embodiments, other arrangements of components 410 and energy transfer device 210 may be utilized and/or implemented.

Turning now to FIGS. 4E and 4F, examples of an information handling system and a device are illustrated, according to one or more embodiments. As shown in FIG. 4E, IHS 110 may include energy transfer device 210 and components 410A and 410B. As illustrated in FIG. 4F, device 420 may include energy transfer device 210 and components 410A and 410B. In one or more embodiments, device 420 may be or include one or more of a memory device (e.g., a storage device), an IoT (Internet of Things) device, a docking device (e.g., a docking station), a display device, a gaming device, a communication device, a satellite, a moon exploring device, a planetary exploring device, and a network device, among others. In one or more embodiments, device 420 may include one or more structures and/or functionalities as those described with reference to IHS 110.

Figure 5:
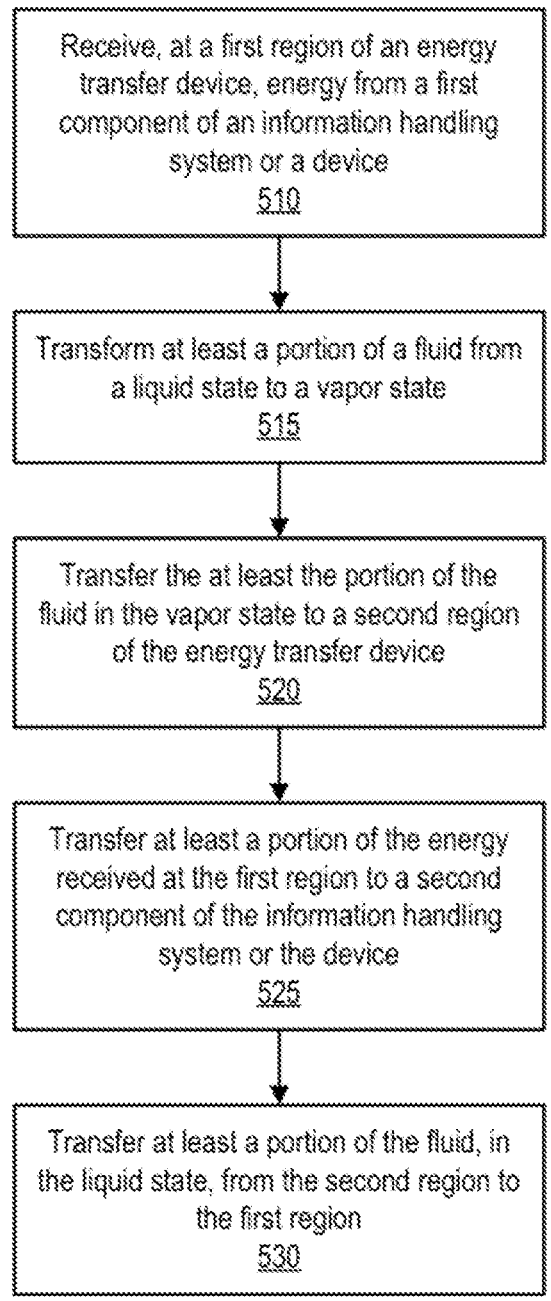
FIG. 5 illustrates a method of operating an energy transfer device, according to one or more embodiments.

Turning now to FIG. 5, a method of operating an energy transfer device is illustrated, according to one or more embodiments. At 510, energy may be received, at a first region of an energy transfer device, from a first component of an information handling system or a device. In one example, energy transfer device 210 may receive energy, at evaporator region 310 (shown in FIG. 3A), from component 410A (shown in FIGS. 4A-4D). In a second example, energy transfer device 210 may receive energy, at evaporator region 310B (shown in FIG. 3B), from component 410B (shown in FIGS. 4B-4D). In another example, energy transfer device 210 may receive energy, at region 330 (shown in FIG. 3C), from component 410B (shown in FIGS. 4B-4D). In one or more embodiments, receiving energy, at a first region, from a first component of an information handling system or a device may include receiving heat, at the first region, from the first component of the information handling system or the device.

At 515, at least a portion of a fluid in a liquid state may be transformed into a vapor state. In one or more embodiments, energy transfer device 210 may include fluid 250. For example, at least a portion of fluid 250 in a liquid state may be transformed into a vapor state. For instance, at least a portion of fluid 250B may be transformed into fluid 250A. In one or more embodiments, a vapor state of a fluid may be or include a gaseous state of the fluid.

At 520, at least the portion of the fluid in the vapor state may be transferred to a second region of the energy transfer device. In one example, at least the portion of the fluid in the vapor state may be transferred to condenser region 320 (shown in FIG. 3A). For instance, the at least the portion of the fluid in the vapor state may be transferred to condenser region 320 (shown in FIG. 3A) via Tesla valve 220 (also shown in FIG. 3A). In a second example, at least the portion of the fluid in the vapor state may be transferred to condenser region 320A (shown in FIG. 3B). For instance, the at least the portion of the fluid in the vapor state may be transferred to condenser region 320A (shown in FIG. 3B) via Tesla valve 220A (also shown in FIG. 3B).

In a third example, at least the portion of the fluid in the vapor state may be transferred to condenser region 320B (shown in FIG. 3B). For instance, the at least the portion of the fluid in the vapor state may be transferred to condenser region 320B (shown in FIG. 3B) via Tesla valve 220B (also shown in FIG. 3B). In another example, at least the portion of the fluid in the vapor state may be transferred to region 330 (shown in FIG. 3C). For instance, the at least the portion of the fluid in the vapor state may be transferred to region 330 (shown in FIG. 3C) via Tesla valve 220A (also shown in FIG. 3C).

At 525, at least a portion of the energy received at the first region may be transferred to a second component of the information handling system. In one example, at least a portion of the energy received at evaporator region 310 (shown in FIG. 3A) may be transferred to component 410B (shown in FIG. 4A). In one instance, component 410B may be or include any of components 120-185, among others. In another instance, component 410B may be or include one or more of a fan, a heatsink, at least a portion of a chassis (e.g., a chassis of IHS 110, a chassis of device 420, etc.), at least a portion of a housing (e.g., a housing of IHS 110, a housing of device 420, etc.), among others. In a second example, at least a portion of the energy received at evaporator region 310A (shown in FIG. 3B) may be transferred to component 410B (shown in FIG. 4B). In one instance, component 410B may be or include any of components 120-185, among others. In another instance, component 410B may be or include one or more of a fan, a heatsink, at least a portion of a chassis (e.g., a chassis of IHS 110, a chassis of device 420, etc.), at least a portion of a housing (e.g., a housing of IHS 110, a housing of device 420, etc.), among others.

In a third example, at least a portion of the energy received at evaporator region 310B (shown in FIG. 3B) may be transferred to component 410C (shown in FIGS. 4B-4D). In one instance, component 410C may be or include any of components 120-185, among others. In another instance, component 410C may be or include one or more of a fan, a heatsink, at least a portion of a chassis (e.g., a chassis of IHS 110, a chassis of device 420, etc.), at least a portion of a housing (e.g., a housing of IHS 110, a housing of device 420, etc.), among others. In another example, at least a portion of the energy received at region 330 (shown in FIG. 3C) may be transferred to component 410C (shown in FIGS. 4B-4D). In one instance, component 410C may be or include any of components 120-185, among others. In another instance, component 410C may be or include one or more of a fan, a heatsink, at least a portion of a chassis (e.g., a chassis of IHS 110, a chassis of device 420, etc.), at least a portion of a housing (e.g., a housing of IHS 110, a housing of device 420, etc.), among others.

In one or more embodiments, transferring at least a portion of the energy received at the first region may be transferred to a second component of the information handling system or the device may include condensing all or some of the at least the portion of the fluid in the vapor state. For example, the second component may remove energy from energy transfer device 210 at, near, or proximate to a condensing region 320 or a multifunction region 330. For instance, removing energy from energy transfer device 210 at, near, or proximate to condensing region 320 or multifunction region 330 may cause all or some of the at least the portion of the fluid in the vapor state to condense into the fluid in the liquid state.

At 530, at least a portion of the fluid in the liquid state may be transferred from the second region to the first region. For example, fluid transfer structure 240 may transfer at least a portion of the fluid in the liquid state from the second region to the first region. For instance, fluid transfer structure 240 may transfer fluid 250B from the second region to the first region. In one or more embodiments, transferring at least a portion of the fluid in the liquid state from the second region to the first region may include wicking the at least the portion of the fluid in the liquid state from the second region to the first region. For example, fluid transfer structure 240 may wick the at least the portion of the fluid in the liquid state from the second region to the first region. For instance, fluid transfer structure 240 may wick fluid 250B from the second region to the first region.

In one or more embodiments, one or more of the method and/or process elements and/or one or more portions of a method and/or processor elements may be performed in varying orders, may be repeated, or may be omitted. Furthermore, additional, supplementary, and/or duplicated method and/or process elements may be implemented, instantiated, and/or performed as desired, according to one or more embodiments. Moreover, one or more of system elements may be omitted and/or additional system elements may be added as desired, according to one or more embodiments.

In one or more embodiments, a memory medium may be and/or may include an article of manufacture. For example, the article of manufacture may include and/or may be a software product and/or a program product. For instance, the memory medium may be coded and/or encoded with processor-executable instructions in accordance with one or more flowcharts, systems, methods, and/or processes described herein to produce the article of manufacture.

The above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. An energy transfer device, comprising:
   a sealed housing having a first evaporating region, a second evaporating region, a first condensing region, and a second condensing region;
   a fluid;
   a first Tesla valve enclosed in the housing, between the first evaporating region and the first condensing region and configured to transfer the fluid in a gaseous state from the first evaporating region to the first condensing region, the first Tesla valve interposing the first evaporating region and the first condensing region;
   a second Tesla value enclosed in the housing and configured to transfer the fluid in the gaseous state from the second evaporating region to the second condensing region, the second Tesla valve interposing the second evaporating region and the second condensing region; and
   a first liquid fluid transfer structure enclosed in the housing, between the first condensing region and the first evaporating region and configured to transfer the fluid in a liquid state from the first condensing region to the first evaporating region.

2. The energy transfer device of claim 1, wherein the liquid fluid transfer structure includes metal sintered particles.

3. The energy transfer device of claim 1, wherein, to transfer the fluid in the liquid state from the first condensing region to the first evaporating region, the liquid fluid transfer structure is further configured to wick the fluid in the liquid state from the first condensing region to the first evaporating region.

4. The energy transfer device of claim 1, wherein the fluid includes one or more of acetone, ammonia, water, and a chlorofluorocarbon.

5. The energy transfer device of claim 1, wherein the first evaporating region is at a first end of the energy transfer device and the first condensing region is at a second end of the energy transfer device.

6. The energy transfer device of claim 1, wherein the first liquid fluid transfer structure includes the first Tesla valve.

7. The energy transfer device of claim 1, further comprising:
   a second liquid fluid transfer structure enclosed in the housing.

8. The energy transfer device of claim 7, wherein the first condensing region and the second evaporating region form a multifunction region.

9. A method of operating an energy transfer device, comprising:
   receiving, at a first region of the energy transfer device, energy from a first component of an information handling system or a device;
   transforming at least a portion of a fluid from a liquid state to a vapor state;

transferring, via a first Tesla valve of the energy transfer device, the at least the portion of the fluid in the vapor state to a second region of the energy transfer device, the first Tesla valve interposing the first and the second regions;

transferring, via a second Tesla valve of the energy transfer device, the at least portion of the fluid in the vapor state from a third region of the energy transfer device to a fourth region of the energy transfer device, the second Tesla valve interposing the third and fourth regions;

transferring at least a portion of the energy received from the first component to a second component of the information handling system or the device, different from the first component; and transferring, via a liquid fluid transfer structure, at least a portion of the fluid, in the liquid state, from the second region to the first region.

10. The method of claim 9, wherein the liquid fluid transfer structure includes metal sintered particles.

11. The method of claim 9, wherein liquid fluid transfer structure includes the Tesla valve.

12. The method of claim 9, wherein the transferring, via the liquid fluid transfer structure, the at least the portion of the fluid, in the liquid state, from the second region to the first region includes wicking, via the liquid fluid transfer structure, the at least the portion of the fluid, in the liquid state, from the second region to the first region.

* * * * *